United States Patent
Fujii et al.

(10) Patent No.: US 9,171,978 B2
(45) Date of Patent: Oct. 27, 2015

(54) EPITAXIAL WAFER, METHOD FOR PRODUCING THE SAME, PHOTODIODE, AND OPTICAL SENSOR DEVICE

(71) Applicant: Sumitomo Electric Industries, Ltd., Osaka-shi (JP)

(72) Inventors: Kei Fujii, Itami (JP); Kaoru Shibata, Itami (JP); Katsushi Akita, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 14/285,234

(22) Filed: May 22, 2014

(65) Prior Publication Data

US 2014/0353584 A1 Dec. 4, 2014

(30) Foreign Application Priority Data

May 28, 2013 (JP) ................... 2013-112214

(51) Int. Cl.
*H01L 31/0304* (2006.01)
*H01L 31/0352* (2006.01)
*H01L 31/18* (2006.01)

(52) U.S. Cl.
CPC .. *H01L 31/035236* (2013.01); *H01L 31/03046* (2013.01); *H01L 31/1844* (2013.01)

(58) Field of Classification Search
CPC ............ H01L 31/03046; H01L 31/035236; H01L 31/036; H01L 31/1844
See application file for complete search history.

(56) References Cited

U.S. PATENT DOCUMENTS

2011/0210313 A1* 9/2011 Fujii et al. ...................... 257/21

FOREIGN PATENT DOCUMENTS

JP 2009-206499 A 9/2009

OTHER PUBLICATIONS

Peter, M. et al., 'MOCVD growth of (Ga1-xInxAs-GaAs1-ySby) superlattices on InP showing type-II emission at wavelengths beyond 2 um,' 1998, 1997 IEEE Symposium on Compound Semiconductors, pp. 117-120.*

Chen et al., 'SWIR/MWIR InP-based p-i-n. photodiodes with InGaAs/GaAsSb type-II quantum wells,' 2011 IEEE Journal of Quantum Electronics, vol. 47, No. 9 pp. 1244-1250.*

R. Sidhu et al., "A Long-Wavelength Photodiode on InP Using Lattice-Matched GaInAs-GaAsSb Type-II Quantum Wells," IEEE Photonics Technology Letters, vol. 17, No. 12, pp. 2715-2717 (2005).

R. Sidhu et al., "A 2.3μm Cutoff Wavelength Photodiode on InP Using Lattice-Matched GaInAs-GaAsSb Type-II Quantum Wells," 2005 International Conference on Indium Phosphide and Related Materials, pp. 148-151 (2005).

* cited by examiner

*Primary Examiner* — Bryan Junge
(74) *Attorney, Agent, or Firm* — Venable LLP; Michael A. Sartori; Trent B. Ostler (57) ABSTRACT

A method for producing an epitaxial wafer includes a step of growing an epitaxial layer structure on a III-V semiconductor substrate, the epitaxial layer structure including a III-V semiconductor multiple-quantum well and a III-V semiconductor surface layer, wherein the step of growing the epitaxial layer structure on the substrate is performed such that a lattice mismatch $\Delta\omega$ of the multiple-quantum well with respect to the substrate satisfies a range of $-0.13\% \leq \Delta\omega < 0\%$ or $0\% < \Delta\omega \leq +0.13\%$, the range having a center displaced from zero, and an X-ray rocking curve in a zero-order diffraction peak derived from the multiple-quantum well has a full width at half maximum (FWHM) of 30 seconds or less.

8 Claims, 4 Drawing Sheets

EPITAXIAL WAFER, METHOD FOR PRODUCING THE SAME, PHOTODIODE, AND OPTICAL SENSOR DEVICE

BACKGROUND OF THE INVENTION

1. Field of the Invention

The present invention relates to an epitaxial wafer, a method for producing the epitaxial wafer, a photodiode, and an optical sensor device. Specifically, the present invention relates to an epitaxial wafer, a method for producing the epitaxial wafer, a photodiode, and an optical sensor device that include a multiple-quantum well (MQW) formed of III-V compound semiconductors and having a bandgap corresponding to the near- to far-infrared region.

2. Description of the Related Art

InP-based semiconductors, which are formed of III-V compounds, have a bandgap energy corresponding to regions ranging from the near-infrared region to the far-infrared region and hence a large number of studies are performed for developing photodiodes for communications, image capturing at night, and the like. For example, R. Sidhu, et al. "A Long-Wavelength Photodiode on InP Using Lattice-Matched GaInAs—GaAsSb Type-II Quantum Wells", IEEE Photonics Technology Letters, Vol. 17, No. 12 (2005), pp. 2715-2717 and R. Sidhu, et al. "A 2.3 μm Cutoff Wavelength Photodiode on InP Using Lattice-Matched GaInAs-GaAsSb Type-II Quantum Wells", 2005 International Conference on Indium Phosphide and Related Materials, pp. 148-151 describe a photodiode in which an InGaAs/GaAsSb type-II MQW is formed on an InP substrate, the photodiode having characteristic sensitivity in the near-infrared region. Japanese Unexamined Patent Application Publication No. 2009-206499 proposes a planar photodiode in which an InGaAs/GaAsSb type-II MQW is formed on an InP substrate and zinc (Zn) serving as a p-type impurity is selectively diffused through a selective diffusion mask pattern, so that pixels are formed so as to be isolated from each other with non-diffusion regions therebetween. On this MQW, an InP window layer and an InGaAs diffusive-concentration-distribution-adjusting layer are disposed. The configuration of such a planar photodiode eliminates the necessity of performing etching for forming a mesa structure and, as a result, allows a decrease in the dark current.

SUMMARY OF THE INVENTION

Each of the above-described photodiodes includes an InGaAs/GaAsSb type-II MQW epitaxially grown on an InP (100) substrate. In this MQW, GaAsSb contains antimony (Sb), which is not easily controlled, and hence high crystallinity is not easily achieved. In particular, it is not easy to obtain InGaAs/GaAsSb type-II MQWs having high crystallinity at high yield and with stability by using metal-organic vapor phase epitaxy, which is suitable for mass production.

Practically, in order to produce products such as photodiodes so as to have uniform quality at high yield and with stability, it is basically important to control the whole epitaxial layer structure. However, in actual production, it is more effective to mainly control some particular epitaxial layers that tend to have low crystallinity.

Accordingly, it is an object of the present invention to provide an epitaxial wafer that includes a multiple-quantum well and can be produced so as to have high crystallinity in actual production; a method for producing the epitaxial wafer; a photodiode; and an optical sensor device.

A method for producing an epitaxial wafer according to an embodiment of the present invention includes a step of growing an epitaxial layer structure on a III-V semiconductor substrate, the epitaxial layer structure including a III-V semiconductor multiple-quantum well and a III-V semiconductor surface layer, wherein the step of growing the epitaxial layer structure on the substrate is performed such that a lattice mismatch $\Delta\omega$ of the multiple-quantum well with respect to the substrate satisfies a range of $-0.13\% \leq \Delta\omega < 0\%$ or $0\% < \Delta\omega \leq +0.13\%$, the range having a center displaced from zero, and an X-ray rocking curve in a zero-order diffraction peak derived from the multiple-quantum well has a full width at half maximum (FWHM) of 30 seconds or less. This method may be performed by metal-organic vapor phase epitaxy.

For example, a method for producing an epitaxial wafer according to an embodiment of the present invention allows production of epitaxial wafers having high crystallinity in actual production.

DESCRIPTION OF THE PREFERRED EMBODIMENTS

Hereinafter, features of embodiments according to the present invention will be sequentially described.

1. Method for Producing Epitaxial Wafer (1) Production Method

This method includes a step of growing an epitaxial layer structure on a III-V semiconductor substrate by metal-organic vapor phase epitaxy, the epitaxial layer structure including a III-V semiconductor multiple-quantum well and a III-V semiconductor surface layer, wherein the step of growing the epitaxial layer structure on the substrate is performed such that a lattice mismatch $\Delta\omega$ of the multiple-quantum well with respect to the substrate satisfies a range of $-0.13\% \leq \Delta\omega < 0\%$ or $0\% < \Delta\omega \leq +0.13\%$, the range having a center displaced from zero, and an X-ray rocking curve in a zero-order diffraction peak derived from the multiple-quantum well has a full width at half maximum (FWHM) of 30 seconds or less.

(2) X-Ray Rocking Curve

The production method is performed such that, in X-ray diffraction (XRD), the zero-order diffraction peak derived from the multiple-quantum well is displaced from the zero-order diffraction peak derived from the substrate. However, compared with this displacement of the diffraction peaks from each other, it is important that the X-ray rocking curve in the zero-order diffraction peak derived from the multiple-quantum well has a small full width at half maximum (FWHM). A large FWHM indicates low crystallinity and a high lattice defect density and hence a photodiode produced from such an epitaxial wafer has a high dark current. For this reason, actual production of epitaxial wafers having a multiple-quantum well is preferably controlled by confirming that the full width at half maximum (FWHM) is small rather than by confirming that the zero-order diffraction peak derived from the multiple-quantum well is displaced from the diffraction peak derived from the substrate. In the production, when the diffraction peak derived from the substrate overlaps the zero-order diffraction peak derived from the multiple-quantum well, since the substrate diffraction peak has a high intensity, it becomes difficult to accurately measure the FWHM value of the X-ray rocking curve in the zero-order diffraction peak derived from the multiple-quantum well. For this reason, in order to displace the diffraction peaks from each other, the lattice mismatch of the multiple-quantum well with respect to the substrate is adjusted so as to satisfy a range having a center displaced from zero. Such displacement of the diffraction peaks from each other makes it possible to accurately confirm that the FWHM of the X-ray rocking curve in the zero-order diffraction peak derived from the multiple-quantum well is 30 seconds or less. Thus, it can be predicted that photodiodes to be provided by actual production have a sufficiently low dark current. By decreasing the FWHM to 27 seconds or less, photodiodes having a lower dark current can be produced. The X-ray rocking curve is measured with the X-ray incident direction being <0-11> and the reflection plane being (400).

(3) Lattice Mismatch

In the case where a multiple-quantum well on a substrate is constituted by a plurality of pairs of Layer a and Layer b that serve as a single pair, the lattice mismatch of the multiple-quantum well is determined as follows. When the lattice mismatch of Layer a with respect to the substrate is represented by $\Delta\omega a$ and the lattice mismatch of Layer b with respect to the substrate is represented by $\Delta\omega b$, the lattice mismatch $\Delta\omega$ of the whole multiple-quantum well is calculated by $\{\Sigma(\Delta\omega a \times \text{thickness of Layer a} + \Delta\omega b \times \text{thickness of Layer b})\}/\{\Sigma(\text{thickness of Layer a} + \text{thickness of Layer b})\}$. In this formula, $\Delta\omega a$ is calculated by (lattice constant of Layer a−lattice constant of substrate)/lattice constant of substrate; $\Delta\omega b$ is calculated by (lattice constant of Layer b−lattice constant of substrate)/lattice constant of substrate; and $\Sigma$ represents the sum in terms of pairs. The denominator of the formula is the total thickness of the multiple-quantum well. The lattice constants of Layers a and b depend on the compositions of these layers. Accordingly, determination of the compositions of Layers a and b and the thicknesses of Layers a and b in the multiple-quantum well allows calculation of the lattice mismatch $\Delta\omega$. Needless to say, the lattice constant of the substrate is known.

By adjusting the lattice mismatch $\Delta\omega$ so as to satisfy a range of $-0.13\% \leq \Delta\omega < 0\%$ or $0\% < \Delta\omega \leq +0.13\%$, the range having a center displaced from zero, for example, the angular difference $\Delta H$ between the diffraction peak of a substrate with a reflection plane being (400) and the diffraction peak of the multiple-quantum well can be made to satisfy a range of $-300 \text{ s} \leq \Delta H < 0 \text{ s}$ or $0 \text{ s} < \Delta H \leq +300 \text{ s}$. That is, these diffraction peaks can be adjusted so as not to overlap. Thus, the FWHM of the X-ray rocking curve in the diffraction peak derived from the multiple-quantum well can be accurately determined. As a result, defects can be detected and countermeasures can be taken not in the final production step but in an earlier stage of epitaxial wafers.

The lattice mismatch $\Delta\omega$ may be adjusted so as to satisfy a range of $-0.13\% \leq \Delta\omega < -0.01\%$ or $+0.01\% < \Delta\omega \leq +0.13\%$. This range may be narrowed to $-0.13\% \leq \Delta\omega < -0.02\%$ or $+0.02\% < \Delta\omega \leq +0.13\%$ in order to ensure separation between the diffraction peaks so that the FWHM of the X-ray rocking curve can be accurately measured. In general, in this technical field, epitaxial layers are defined so as to satisfy a lattice match condition; and this condition is that the lattice mismatch $\Delta\omega$ satisfies $-0.01\% \leq \Delta\omega \leq +0.01\%$. In contrast, the condition of $-0.13\% \leq \Delta\omega < -0.01\%$ or $+0.01\% < \Delta\omega \leq +0.13\%$ of an embodiment does not overlap the standard lattice match condition and is completely out of the range of this condition, hence a very unique condition in the technical field. By forming a multiple-quantum well so as to be out of the range of the lattice match condition with certainty, there is no possibility that the diffraction peak of the substrate and the diffraction peak of the multiple-quantum well overlap. As a result, the FWHM of the X-ray rocking curve of the multiple-quantum well can be accurately determined.

(4) InGaAs/GaAsSb Type-II Multiple-Quantum Well

The method for producing an epitaxial wafer may be performed such that the substrate is an InP substrate and the multiple-quantum well is an InGaAs/GaAsSb type-II multiple-quantum well. This method allows actual production of photodiodes having sensitivity for the near-infrared region and having a low dark current at high production yield and with stability. This InGaAs/GaAsSb type-II multiple-quantum well is desirably formed such that, for example, an InGaAs-containing buffer layer is interposed between the InP substrate and the multiple-quantum well for the purpose of providing a multiple-quantum well having a small FWHM. In the case of producing a planar photodiode, an InGaAs layer is desirably interposed between the surface layer and the multiple-quantum well. The reason for this is as follows. The multiple-quantum well is vulnerable to impurities such as Zn. In the case where pixels are formed by selective diffusion of zinc (Zn), an InGaAs layer is desirably disposed between the surface layer and the multiple-quantum well to suppress diffusion of Zn at a high concentration into the multiple-quantum well and the resultant degradation of crystallinity. For example, in the case where the surface layer is formed of InP, the diffusion rate of Zn in the underlying InGaAs layer is lower than in the InP surface layer. Thus, in the InGaAs layer, a transition region can be easily formed in which a sharp drop of the concentration of Zn occurs from the surface-layer high-concentration region to a low-concentration region. Accordingly, the InGaAs layer, which allows formation of the low-concentration region extending to the multiple-quantum well, functions as a diffusive-concentration-distribution-adjusting layer for Zn.

In the case where an InP substrate is prepared and an InGaAs/GaAsSb type-II multiple-quantum well is grown thereon, the multiple-quantum well including a plurality of pairs (in general, 50 or more and 400 or less pairs) of an InGaAs layer and a GaAsSb layer that serve as a single pair, the lattice mismatch $\Delta\omega$ of the multiple-quantum well is determined as follows. When the lattice mismatch of the InGaAs layer with respect to the InP substrate is represented by $\Delta\omega a$ and the lattice mismatch of the GaAsSb layer with respect to the InP substrate is represented by $\Delta\omega b$, the lattice mismatch $\Delta\omega$ of the whole multiple-quantum well is calculated by $\{\Sigma(\Delta\omega a \times \text{thickness of InGaAs layer} + \Delta\omega b \times \text{thickness of GaAsSb layer})\}/\{\Sigma(\text{thickness of InGaAs layer} + \text{thickness of GaAsSb layer})\}$. In this formula, $\Delta\omega a$ is calculated by (lattice constant of InGaAs layer−lattice constant of InP substrate)/lattice constant of InP substrate; $\Delta\omega b$ is calculated by (lattice constant of GaAsSb layer−lattice constant of InP substrate)/lattice constant of InP substrate; and $\Sigma$ represents the sum in terms of pairs. The denominator of the formula is the total thickness of the multiple-quantum well. The lattice constants of InGaAs and GaAsSb depend on the compositions of these layers. Accordingly, determination of the thicknesses of InGaAs and GaAsSb in the multiple-quantum well allows calculation of the lattice mismatch. When a target absorption wavelength region is decided, usable compositions of InGaAs and GaAsSb in the multiple-quantum well are narrowed down. The absorption wavelength region to be provided does not solely depend on a single composition. The absorption wavelength region is also strongly influenced by the thickness of the multiple-quantum well. In particular, the absorption wavelength region is strongly influenced by the Sb composition and film thickness of GaAsSb. These factors are controlled to allow the target absorption wavelength region and the other composition is also adjusted so that the lattice mismatch with respect to the substrate is made to satisfy the above-described range displaced from zero. The InP substrate has a lattice constant of 0.5869 nm. The lattice constant (nm) of InGaAs in which Ga composition is represented by x satisfies the following formula: lattice constant of $In_{1-x}Ga_xAs = 0.60583 - 0.04050x$. The lattice constant (nm) of GaAsSb in which Sb composition is represented by y satisfies the following formula: lattice constant of $GaAs_{1-y}Sb_y = 0.56533 + 0.04427y$. In the case where the lattice mismatch of the multiple-quantum well with respect to the substrate is adjusted so as to satisfy a range displaced from zero as described above, the buffer layer may be formed so as to have the same lattice constant as the multiple-quantum well or the substrate.

(5) Metal-Organic Vapor Phase Epitaxy (i) FWHM and Growth Method

In general, a multiple-quantum well constituted by several pairs up to about 10 pairs and having a relatively small total film thickness is grown by molecular beam epitaxy (MBE) or metal-organic vapor phase epitaxy. In such a case, as long as the lattice mismatch $\Delta\omega$ substantially satisfies $-0.1\% \leq \Delta\omega \leq +0.1\%$, the FWHM of the multiple-quantum well can be decreased to a small value on the practical level. In general, another multiple-quantum well constituted by more than 50 pairs and having a large total film thickness is grown by MBE. In such a case, unless the lattice mismatch $\Delta\omega$ satisfies $-0.01\% \leq \Delta\omega \leq +0.01\%$, it is difficult to decrease the FWHM of the multiple-quantum well to a small value on the practical level. This is because, even when multiple-quantum wells having different film thicknesses have the same lattice mismatch, strain is accumulated in the multiple-quantum well having the larger film thickness and the crystallinity tends to be degraded. This tendency becomes strong in multiple-quantum wells constituted by 100 pairs, 200 pairs, or more pairs. It is difficult to provide a multiple-quantum well that satisfies both a large lattice mismatch and a large total film thickness. However, the inventor of the present invention has found that, by performing growth from a multiple-quantum well to a surface layer at a growth temperature lower than the standard temperature, even in the case of a relatively large lattice mismatch, the FWHM of the multiple-quantum well can be decreased to 30 seconds or less. Specifically, the growth temperature during growth from a multiple-quantum well to a surface layer by metal-organic vapor phase epitaxy is preferably 525° C. or less, more preferably 500° C. or less, still more preferably 475° C. or less. By employing such a low growth temperature, even when the lattice mismatch with respect to the substrate is within the above-described range, the FWHM of the X-ray rocking curve in the diffraction peak can be decreased to 30 seconds or less.

(ii) Source Gases

GaAs Sb is preferably deposited with triethylgallium (TEGa), tertiarybutylarsine (TBAs), and trimethylantimony (TMSb). InGaAs may be deposited with TEGa, trimethylindium (TMIn), and TBAs. These source gases are all metal-organic gases and are high-molecular-weight compounds. Accordingly, the source gases can be completely decomposed at a relatively low temperature of 400° C. or more and 525° C. or less, contributing to crystal growth. Examples of a Ga (gallium) source include TEGa (triethylgallium) and trimethylgallium (TMGa). Examples of an In (indium) source include TMIn (trimethylindium) and triethylindium (TEIn). Examples of an As (arsenic) source include TBAs (tertiarybutylarsine) and trimethylarsenic (TMAs). Examples of an Sb (antimony) source include TMSb (trimethylantimony), triethylantimony (TESb), triisopropylantimony (TIPSb), and trisdimethylaminoantimony (TDMASb). When the surface layer is formed of InP, source gases are preferably TMIn (trimethylindium) and tertiarybutylphosphine (TBP). This is because these source gases are decomposed at low temperatures and growth at a low temperature of 525° C. or less can be performed. By using such sources, an epitaxial wafer including a MQW having a low impurity concentration, high crystallinity, and a small FWHM can be obtained. As a result, when such an epitaxial wafer is used to produce, for example, a photodiode, this photodiode has a low dark current and high sensitivity. Such a photodiode can be used to provide an optical sensor device that can capture clearer images, for example, an image pickup device.

2. Epitaxial Wafer

An epitaxial wafer according to an embodiment of the present invention includes a III-V semiconductor layer structure. This epitaxial wafer includes a III-V semiconductor substrate; and a III-V semiconductor multiple-quantum well disposed on the substrate, wherein a lattice mismatch $\Delta\omega$ of the multiple-quantum well with respect to the substrate satisfies a range of $-0.13\% \leq \Delta\omega < 0\%$ or $0\% < \Delta\omega \leq +0.13\%$, and an X-ray rocking curve in a zero-order diffraction peak derived from the multiple-quantum well of the epitaxial wafer has a full width at half maximum (FWHM) of 30 seconds or less.

When such a configuration is employed, actual production of epitaxial wafers including a multiple-quantum well can be controlled by confirming that the X-ray rocking curve in the zero-order diffraction peak derived from each multiple-quantum well has a small full width at half maximum (FWHM). When the zero-order diffraction peak derived from the substrate overlaps the zero-order diffraction peak derived from the multiple-quantum well, since the substrate-derived diffraction peak has a high intensity, it becomes difficult to measure the FWHM value of the X-ray rocking curve in the zero-order diffraction peak derived from the multiple-quantum well. For this reason, in order to displace the zero-order diffraction peaks from each other, as described above, the lattice mismatch of the multiple-quantum well with respect to the substrate is adjusted so as to satisfy a range having a center displaced from zero. When the FWHM of the X-ray rocking curve in the zero-order diffraction peak derived from the multiple-quantum well is adjusted so as to be 30 seconds or less, for example, photodiodes to be provided by actual production have a sufficiently low dark current. By decreasing the FWHM to 27 seconds or less, photodiodes having a lower dark current can be produced.

3. Photodiode

It has been demonstrated that, in actual production, a photodiode having the above-described layer structure of the epitaxial wafer has a sufficiently small FWHM of the multiple-quantum well. Accordingly, when a photodiode is produced from such an epitaxial wafer, the resultant photodiode has a low dark current and high quality. When such a photodiode and a read-out integrated circuit (IC) are integrated to produce an optical sensor device such as an image pickup device, the device has a low dark current and can provide images having a high signal-to-noise (S/N) ratio.

4. Fundamentals of Embodiments of the Present Invention

Fundamentals of embodiments of the present invention are to satisfy the following two features that defy the common general technical knowledge: (1) the lattice mismatch Δω of a multiple-quantum well with respect to a substrate is adjusted so as to satisfy a range displaced from zero and (2) the full width at half maximum (FWHM) of the X-ray rocking curve in the diffraction peak derived from the multiple-quantum well is adjusted so as to be 30 seconds or less. When both of these two features are satisfied, the crystallinity of multiple-quantum wells in epitaxial wafers or photodiodes can be accurately controlled.

Hereinafter, specific examples including epitaxial wafers according to embodiments of the present invention will be described with reference to drawings. However, the present invention is not limited to these examples. The scope of the present invention is indicated by Claims and is intended to embrace all the modifications within the meaning and range of equivalency of the Claims.

Figure 1:
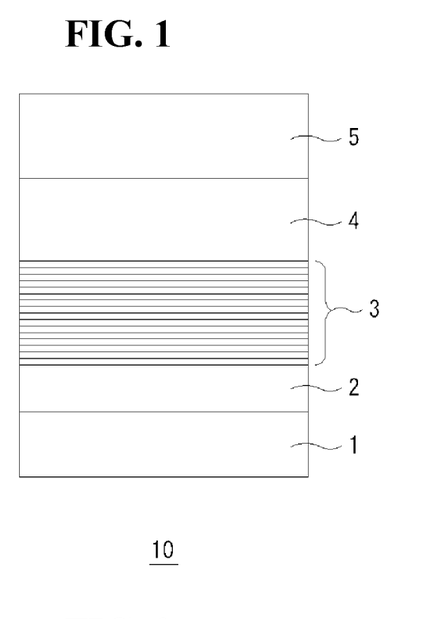
FIG. 1 illustrates an epitaxial wafer according to an embodiment of the present invention.

FIG. 1 is a sectional view illustrating an epitaxial wafer 10 according to an embodiment of the present invention. In FIG. 1, the epitaxial wafer 10 has the following epitaxial layer structure formed of III-V compounds on an InP substrate 1.

n-type InGaAs buffer layer 2/type-II (InGaAs/GaAsSb) multiple-quantum well serving as absorption layer 3/InGaAs diffusive-concentration-distribution-adjusting layer 4/InP window layer (surface layer) 5

The type-II multiple-quantum well constituted by pairs of InGaAs/GaAsSb may have compositions of, for example, $In_{0.59}Ga_{0.41}As$ and $GaAs_{0.57}Sb_{0.43}$. However, the compositions can be changed in accordance with the target lattice mismatch Δω. The combination of film thicknesses of InGaAs/GaAsSb is not particularly limited and the film thickness of each layer can be appropriately selected from the range of 2 to 6 nm. For example, InGaAs/GaAsSb preferably have film thicknesses of 5 nm/5 nm. The number of pairs is 150 or more, for example, 250 because a type-II multiple-quantum well serving as the absorption layer 3 absorbs light through transition of electrons in interfaces of the multiple-quantum well and hence preferably has a large number of interfaces, that is, a large number of pairs. The buffer layer 2 may be formed of InGaAs or InP, or may be a composite layer formed of InGaAs and InP.

Figure 2:
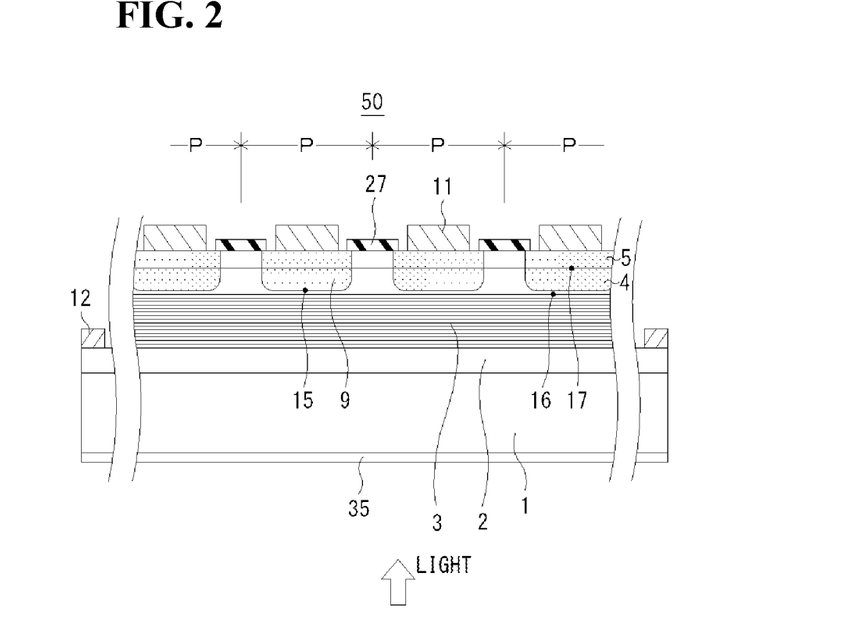
FIG. 2 is a sectional view of a photodiode produced from the epitaxial wafer in FIG. 1.

FIG. 2 is a sectional view of a photodiode 50 formed from the epitaxial wafer 10 in FIG. 1. As illustrated in FIG. 2, the photodiode 50 has the following configuration:

InP substrate 1/n-type InGaAs buffer layer 2/type-II ($In_{0.59}Ga_{0.41}As/GaAs_{0.57}Sb_{0.43}$) multiple-quantum well serving as absorption layer 3/InGaAs diffusive-concentration-distribution-adjusting layer 4/InP window layer 5

The photodiode 50 is a planar photodiode including pixels P that are isolated from neighboring pixels P with regions in which the impurity is not diffused. Alternatively, the epitaxial wafer 10 according to the embodiment may be applied to a mesa-type photodiode including pixels that are isolated with mechanically formed trenches. In the planar photodiode, p-type regions 9 extend from the InP window layer 5 to the diffusive-concentration-distribution-adjusting layer 4. These p-type regions 9 are formed by selectively diffusing Zn serving as a p-type impurity through openings of a SiN film serving as a selective diffusion mask pattern 27. The p-type regions 9 are isolated from neighboring p-type regions 9 with regions in which the impurity is not diffused. Thus, the pixels P are configured to output individual absorption data.

On each of the p-type regions 9, a p-electrode 11 formed of AuZn is disposed so as to form an ohmic contact with the p-type region 9. An n-electrode 12 formed of AuGeNi is disposed on the exposed surface end portion of the buffer layer 2 so as to form an ohmic contact with the buffer layer 2, which is disposed in contact with the InP substrate 1. The buffer layer 2 is doped with an n-type impurity so as to have a predetermined level of conductivity. In this case, the InP substrate 1 may be an n-type substrate or a semi-insulating substrate such as an InP substrate doped with iron (Fe). An InP substrate doped with iron (Fe) is used in the photodiode in FIG. 2. Light enters the InP substrate 1 through the back surface thereof. In order to suppress reflection of incident light, an anti-reflection (AR) film 35 formed of, for example, SiON covers the back surface of the InP substrate 1.

A p-n junction 15 is formed at a position corresponding to the boundary front of the p-type region 9. By applying a reverse bias voltage between the p-electrode 11 and the n-electrode 12, in the absorption layer 3, a depletion layer is formed in a larger area on a side in which the concentration of the n-type impurity is lower (n-type impurity background side). The background impurity concentration in the absorption layer 3 having a type-II multiple-quantum well or in the InGaAs diffusive-concentration-distribution-adjusting layer 4 is, in terms of n-type impurity concentration (carrier concentration), about $1 \times 10^{16}$ $cm^{-3}$ or less. The position of the p-n junction 15 is determined from the point of intersection of the background (n-type carrier concentration) and the concentration profile of p-type impurity Zn in the absorption layer 3 having a multiple-quantum well or the InGaAs diffusive-concentration-distribution-adjusting layer 4. In the InGaAs diffusive-concentration-distribution-adjusting layer 4, the concentration of the p-type impurity selectively diffused through the surface of the InP window layer 5 sharply drops from the high-concentration region (about $1 \times 10^{18}$ to about $5 \times 10^{18}$ $cm^{-3}$) on the InP-window-layer 5 side to the absorption-layer 3 side. Accordingly, in the InGaAs diffusive-concentration-distribution-adjusting layer 4, a Zn concentration of $5 \times 10^{16}$ $cm^{-3}$ or less can be easily achieved. Thus, the diffusive-concentration-distribution-adjusting layer 4 is formed for the following purpose: diffusion of the impurity is controlled such that the concentration of the impurity in the multiple-quantum well 3 is adjusted so as not to become high, while the p-n junction 15 is formed in the upper surface of the type-II multiple-quantum well 3 in which degradation of crystallinity tends to be caused by the impurity, or in a region near the upper surface of the multiple-quantum well 3. However, formation of the diffusive-concentration-distribution-adjusting layer 4 may be omitted.

A photodiode 10 according to an embodiment of the present invention is intended to have sensitivity from the near-infrared region to the longer wavelength range. Accordingly, the window layer (surface layer) 5 is formed of a material having a bandgap energy larger than the bandgap energy of the absorption layer 3. For this reason, the window layer is generally formed of InP, which is a material that has a larger bandgap energy than the absorption layer and is highly lattice-matched. Alternatively, InAlAs, which substantially has the same bandgap energy as InP, may be used. The InGaAs diffusive-concentration-distribution-adjusting layer 4 has a smaller bandgap energy than InP, but has a lower Zn diffusion rate than InP and hence is suitable for adjusting the Zn impurity concentration.

Figure 3:
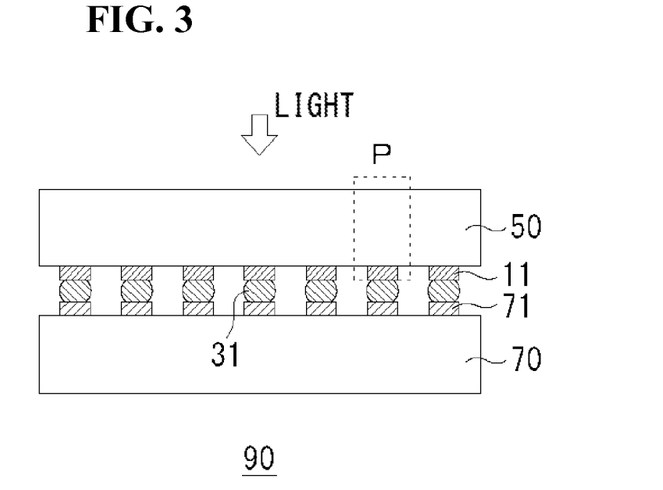
FIG. 3 illustrates an optical sensor device including the photodiode in FIG. 2.

FIG. 3 illustrates an optical sensor device 90 including the photodiode 50 in FIG. 2. In FIG. 3, optical parts such as a lens are not shown. The photodiode 50 is connected to a complementary metal oxide semiconductor (CMOS) 70 serving as a read-out integrated circuit (read-out IC). Read-out electrodes 71 of the CMOS 70 are connected to pixel electrodes (p-electrodes) 11 of the photodiode 50 via interconnection bumps 31. A common ground electrode (n-electrode, not shown) for the pixels of the photodiode 50 is connected to the ground electrode (not shown) of the CMOS 70 also via a bump. The CMOS 70 is combined with the photodiode 50 such that pixels are configured to collect individual absorption data to thereby provide the optical sensor device 90 such as an image pickup device. As described above, the photodiode 50 produced from an epitaxial wafer according to an embodiment of the present invention has sensitivity from the near-infrared region to the far-infrared region and has a low dark current (leakage current). Accordingly, use of the photodiode 50 allows examinations with high accuracy in, for example, researches on living bodies such as animals and plants and environmental monitoring.

Figure 4:
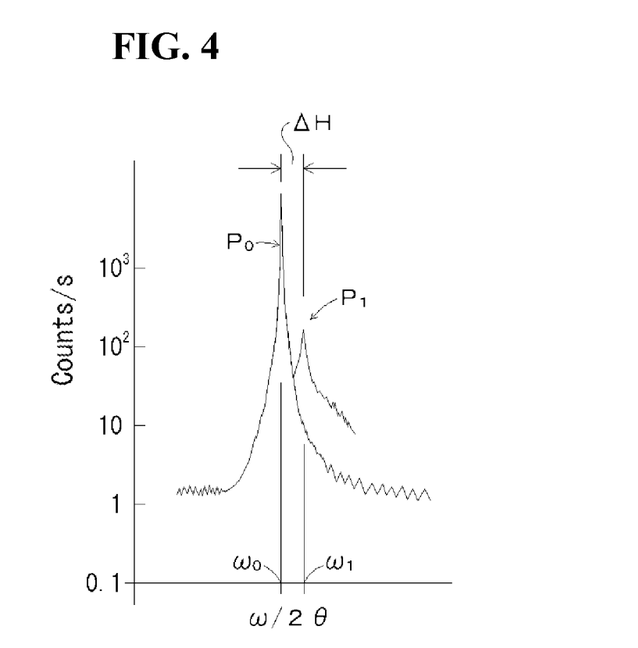
FIG. 4 is a schematic view illustrating the X-ray diffraction $\omega-2\theta$ scan pattern of the epitaxial wafer in FIG. 1.
Figure 5:
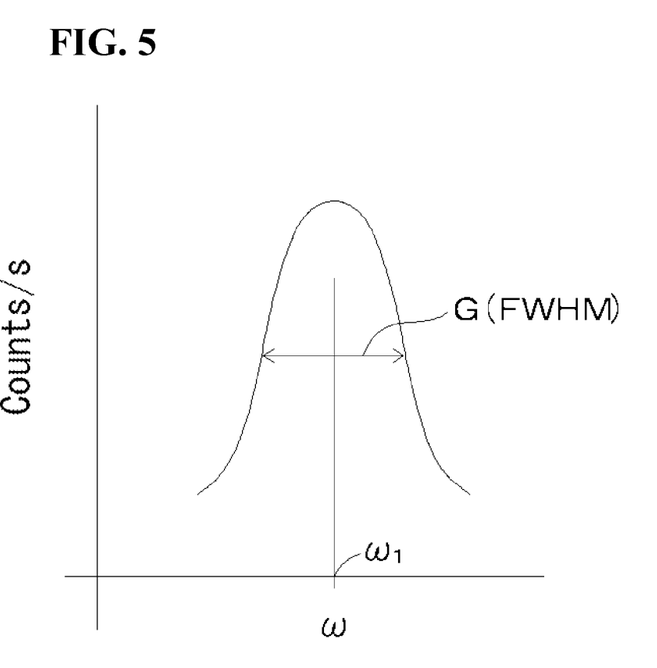
FIG. 5 illustrates an X-ray rocking curve in the zero-order diffraction peak derived from a multiple-quantum well in FIG. 4.

FIG. 4 is a schematic view of the XRD $\omega$–$2\theta$ scan pattern of the epitaxial wafer 10 in FIG. 1. In FIG. 4, the diffraction peak $P_0$ derived from the substrate 1 is located at angle $\omega_0$ and the zero-order diffraction peak $P_1$ derived from the multiple-quantum well 3 is located at angle $\omega_1$. FIG. 5 is a schematic view of an X-ray rocking curve pattern of the zero-order diffraction peak $P_1$ derived from the multiple-quantum well 3 located at angle $\omega_1$ in FIG. 4. In FIG. 4, the diffraction peak $P_0$ derived from the substrate 1 and located at angle $\omega_0$ is separated from, by $\Delta H$, the zero-order diffraction peak $P_1$ derived from the multiple-quantum well 3 and located at angle $\omega_1$. Accordingly, in the X-ray rocking curve pattern in FIG. 5, the full width at half maximum (FWHM) G of the zero-order diffraction peak $P_1$ derived from the multiple-quantum well 3 alone can be measured with high accuracy. In the case where $\Delta H$ is zero and the two diffraction peaks $P_0$ and $P_1$ overlap, since the diffraction peak $P_0$ derived from the substrate 1 has a much stronger diffraction intensity than the zero-order diffraction peak $P_1$ derived from the multiple-quantum well 3 and conceals the zero-order diffraction peak $P_1$. In this case, it is difficult to measure with high accuracy the FWHM G of the zero-order diffraction peak $P_1$ derived from the multiple-quantum well 3 in the X-ray rocking curve pattern in FIG. 5. For this reason, the diffraction peak $P_0$ derived from the substrate 1 and the zero-order diffraction peak $P_1$ derived from the multiple-quantum well 3 are adjusted so as to be separated from each other.

However, the peak angular difference $\Delta H$ in an XRD $\omega$–$2\theta$ scan pattern considerably varies depending on conditions such as the reflection plane measured. Accordingly, instead of the peak angular difference $\Delta H$ in an XRD $\omega$–$2\theta$ scan pattern, lattice mismatch $\Delta\omega$ with respect to a substrate, which is equivalent to $\Delta H$, is used. $\Delta\omega$ is considered to be equivalent to $\Delta H$. $\Delta\omega$ is not affected by the reflection plane measured. As described above, determination of the compositions of InGaAs and GaAsSb, the lattice constant of the InP substrate, and thicknesses of InGaAs and GaAsSb in the multiple-quantum well 3 allows calculation of $\Delta\omega$.

Figure 6:
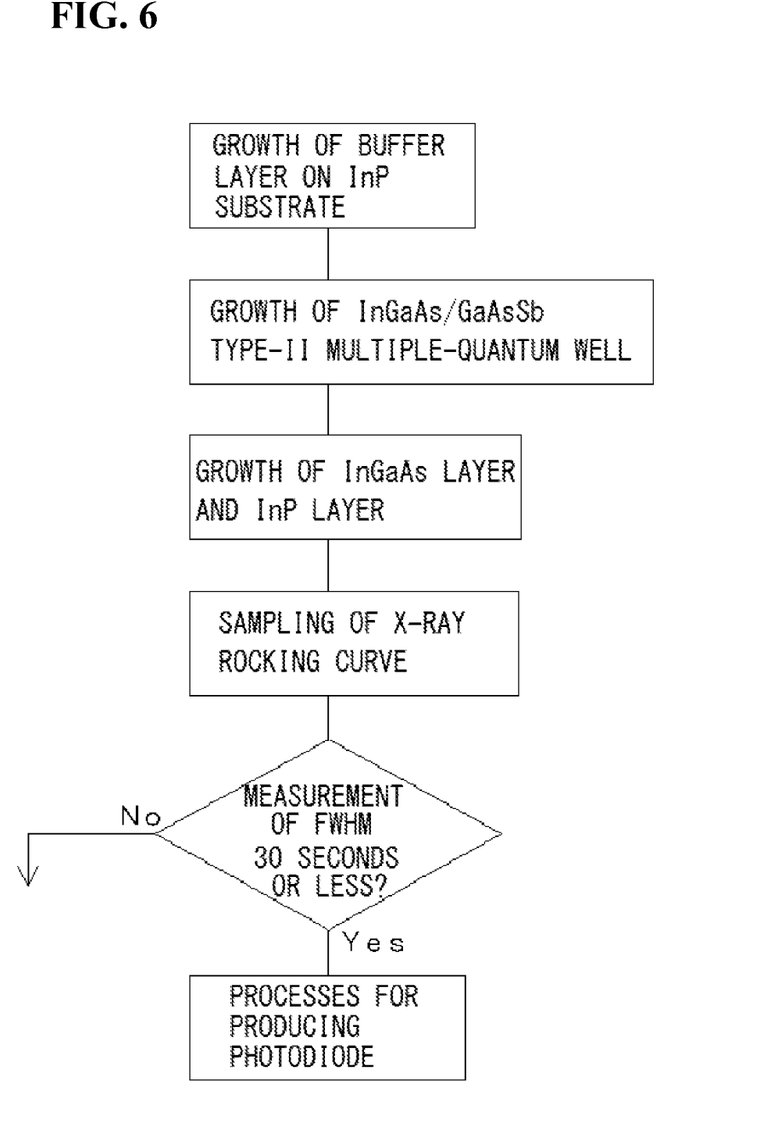
FIG. 6 is a flow chart of a method for producing an epitaxial wafer and a photodiode according to an embodiment.

FIG. 6 is a flow chart of a production method according to an embodiment. Metal-organic vapor phase epitaxy is performed in a growth chamber to form, on the InP substrate 1, the buffer layer 2 that is an InGaAs layer, an InP layer, or an InGaAs/InP composite layer. Continuously, within the same growth chamber, the InGaAs/GaAsSb type-II multiple-quantum well is grown such that the lattice mismatch $\Delta\omega$ satisfies the above-described range. This growth is preferably performed with the sources and at the growth temperature described above in "(5) Metal-organic vapor phase epitaxy" in "1. Method for producing epitaxial wafer". As a result, the condition of the lattice mismatch $\Delta\omega$ can be satisfied and the FWHM of the diffraction peak of the InGaAs/GaAsSb type-II multiple-quantum well can be adjusted so as to be 30 seconds or less. Subsequently, the InGaAs diffusive-concentration-distribution-adjusting layer 4 is grown so as to be in contact with the multiple-quantum well 3, and the InP window layer 5 is grown thereon. Thus, the epitaxial wafer 10 in FIG. 1 has been produced. The growth is continuously performed within the same growth chamber from the initiation of the growth of the multiple-quantum well 3 to the end of the growth of the InP window layer 5. As a result, interfaces 16 and 17 in FIG. 2 are not formed as regrown interfaces and hence do not contain residual oxygen or carbon at a high concentration of $1\times10^{17}$ $cm^{-3}$ or more. Thus, the dark current can be effectively suppressed.

Subsequently, an X-ray rocking curve is sampled from the epitaxial wafer 10. In the X-ray rocking curve, when the FWHM of the zero-order diffraction peak derived from the multiple-quantum well 3 is found to be 30 seconds or less, the epitaxial wafer 10 is sent to subsequent steps for producing a photodiode that include selective diffusion and formation of electrodes. Actions to be taken in the case where the FWHM is found to be more than 30 seconds, can be appropriately decided.

EXAMPLES

Four epitaxial wafers (Samples) each having the same layer structure as in FIG. 1 were produced. Specifically, each Sample had a layer structure including an InP substrate 1, an n-type InGaAs buffer layer 2, a type-II multiple-quantum well 3 constituted by 250 pairs of InGaAs (5 nm) and GaAsSb (5 nm), an InGaAs diffusive-concentration-distribution-adjusting layer 4, and an InP window layer 5. Metal-organic vapor phase epitaxy was performed at growth temperatures of 525° C. or less. In particular, the multiple-quantum well was grown at 500° C. Each Sample was produced so as to have the following lattice mismatch by adjusting the Sb composition of the above-described GaAs Sb.

Sample A1: lattice mismatch $\Delta\omega=0.06\%$
Sample A2: lattice mismatch $\Delta\omega=-0.03\%$
Sample A3: lattice mismatch $\Delta\omega=0.11\%$
Sample B1: lattice mismatch $\Delta\omega=-0.14\%$ X-ray rocking curves in terms of (400) plane were sampled from the four epitaxial-wafer Samples and the FWHM of each curve was measured. The four epitaxial-wafer Samples were subjected to processes to provide planar photodiodes each including a single pixel (FIG. 2 illustrates an example of a planar photodiode). These photodiodes were measured in terms of dark current at a temperature of −50° C. and at a voltage of −1 V and evaluated into one of three ranks: Rank A (dark current of less than 5 pA), Rank B (dark current of 5 to 100 pA), and Rank D (dark current of 1,000 to 3,000 pA). The results are summarized in Table below.

TABLE

| | Sample | | | |
|---|---|---|---|---|
| | A1 | A2 | A3 | B1 |
| Lattice mismatch: $\Delta\omega$ (%) | 0.06 | −0.03 | 0.11 | −0.14 |
| FWHM (s) | 14 | 24 | 26 | 32 |
| Dark current in photodiode (A) | Rank A | Rank B | Rank B | Rank D |

Table indicates that photodiodes have low dark currents in Samples A1 to A3 according to embodiments of the present invention in each of which the zero-order diffraction peak derived from the multiple-quantum well has a FWHM of 30 seconds or less. In particular, Sample A1 having a small FWHM has a very low dark current. In contrast, Samples B1 having a FWHM of more than 30 seconds has a high dark current and cannot be practically used. The results of Examples indicate the importance of measuring epitaxial wafers in terms of X-ray rocking curve. Specifically, the zero-order diffraction peak derived from the multiple-quantum well is adjusted so as to be displaced from the zero-order diffraction peak derived from the substrate, so that the FWHM of the X-ray rocking curve in the zero-order diffraction peak derived from the multiple-quantum well is accurately measured. As a result, a dark current in the photodiode to be provided can be estimated with sufficiently high accuracy.

According to an embodiment of the present invention, an X-ray rocking curve in the zero-order diffraction peak derived from a multiple-quantum well is sampled from an epitaxial wafer, and the FWHM of the X-ray rocking curve is accurately measured, so that a dark current in the photodiode to be provided can be estimated with high accuracy. In order to achieve the accurate measurement of FWHM, it is important that the zero-order diffraction peak derived from the multiple-quantum well is adjusted so as to be displaced from the zero-order diffraction peak derived from the substrate. When use of photodiodes having sensitivity from the near-infrared region to the far-infrared region becomes widespread in the future, embodiments of the present invention are expected to contribute to mass production of photodiodes at high production yield and with stability.

What is claimed is:

1. A method for producing an epitaxial wafer, the method comprising:
    a step of growing an epitaxial layer structure on a III-V semiconductor substrate, the epitaxial layer structure including a III-V semiconductor multiple-quantum well and a III-V semiconductor surface layer,
    wherein the step of growing the epitaxial layer structure on the substrate is performed such that a lattice mismatch $\Delta\omega$ of the multiple-quantum well with respect to the substrate satisfies a range of $-0.13\% \leq \Delta\omega < 0\%$ or $0\% < \Delta\omega \leq +0.13\%$, the range having a center displaced from zero, and an X-ray rocking curve in a zero-order diffraction peak derived from the multiple-quantum well has a full width at half maximum of 30 seconds or less,
    wherein the substrate is an InP substrate and the multiple-quantum well is an InGaAS/GaAsSb type-II multiple-quantum well, wherein the multiple-quantum well includes 50 or more pairs of quantum wells,
    wherein the epitaxial layer structure is grown by metal-organic vapor phase epitaxy at a growth temperature of 400° C. or more and 500° C. or less.

2. The method according to claim 1, wherein the lattice mismatch $\Delta\omega$ satisfies a range of $-0.13\% \leq \Delta\omega < -0.01\%$ or $+0.01\% < \Delta\omega \leq +0.13\%$.

3. The method according to claim 1, wherein the number of pairs is 150 or more and 400 or less.

4. An epitaxial wafer including a III-V semiconductor layer structure, the epitaxial wafer comprising:
    a III-V semiconductor substrate; and
    a III-V semiconductor multiple-quantum well disposed on the substrate,
    wherein a lattice mismatch $\Delta\omega$ of the multiple-quantum well with respect to the substrate satisfies a range of $-0.13\% \leq \Delta\omega < 0\%$ or $0\% < \Delta\omega \leq +0.13\%$, and an X-ray rocking curve in a zero-order diffraction peak derived from the multiple-quantum well of the epitaxial wafer has a full width at half maximum of 30 seconds or less,
    wherein the substrate is an InP substrate and the multiple-quantum well is an InGaAs/GaAsSb type-II multiple-quantum well, wherein the multiple-quantum well includes 50 or more pairs of quantum wells.

5. The epitaxial wafer according to claim 4, wherein the lattice mismatch $\Delta\omega$ satisfies a range of $-0.13\% \leq \Delta\omega < -0.01\%$ or $+0.01\% < \Delta\omega \leq +0.13\%$.

6. The epitaxial wafer according to claim 4, wherein the number of pairs is 150 or more and 400 or less.

7. A photodiode comprising the layer structure of the epitaxial wafer according to claim 4.

8. An optical sensor device comprising the photodiode according to claim 7 and a read-out integrated circuit.

* * * * *